United States Patent [19]

Quinn

[11] 4,425,075
[45] Jan. 10, 1984

[54] WAFER ALIGNERS

[75] Inventor: Peter W. Quinn, Danbury, Conn.

[73] Assignee: The Perkin-Elmer Corporation, Norwalk, Conn.

[21] Appl. No.: 255,415

[22] Filed: Apr. 20, 1981

[51] Int. Cl.³ .................... B65G 51/02; B65G 47/24
[52] U.S. Cl. .................................. 414/755; 406/87; 414/774
[58] Field of Search .................. 414/755, 774, 775; 406/87; 198/380

[56] References Cited

U.S. PATENT DOCUMENTS

| | | | |
|---|---|---|---|
| 3,890,508 | 6/1975 | Sharp | 406/87 X |
| 3,930,684 | 1/1976 | Lasch, Jr. et al. | 406/87 X |
| 3,982,627 | 9/1976 | Isohata | 414/755 X |
| 4,165,132 | 8/1979 | Hassan et al. | 406/87 X |
| 4,219,110 | 8/1980 | Ubukata | 406/87 X |
| 4,242,038 | 12/1980 | Santini et al. | 414/755 |

OTHER PUBLICATIONS

Gardineer, B. G. and S. A. Manning; Automatic Edge Location for Pneumatic Orientor; IBM Technical Disclosure Bulletin; vol. 20, No. 2; Jul. 1977.
O'Neill, B. C., J. A. Paivanas, E. S. Pearson; Annular Orientor; IBM Technical Disclosure Bulletin, vol. 20, No. 2, Jul. 1977.
Gardineer, B. G; Pneumatic Orientor Adaptive Pulse Sequence; IBM Technical Disclosure Bulletin, vol. 20, No. 6, Nov. 1977.

Primary Examiner—Joseph E. Valenza
Assistant Examiner—Janice Krizek
Attorney, Agent, or Firm—S. A. Giarratana; E. T. Grimes; T. P. Murphy

[57] ABSTRACT

An apparatus for prealigning a silicon wafer prior to transfer to a work station. The wafer is spun on an aligning platform by means of air jets emanating from holes disposed in the surface of the platform while simultaneously being stopped by means of a vacuum source communicating with the surface of the platform. Sensor means detect when the wafer is centered within a first predetermined tolerance to turn off the air jets and vacuum to stop the wafer. Control means responsive to the sensor means then center the wafer to within a second predetermined tolerance. The wafer is then transported to the work station for processing.

4 Claims, 7 Drawing Figures

WAFER ALIGNERS

BACKGROUND OF THE INVENTION

Fabrication of integrated circuits requires that each silicon wafer undergo a series of distinct processes. The silicon wafer which is precoated with one or more thin layers of metals or metal oxides receives a coating of photoresist. The wafer is then light exposed to circuit patterns through a mask containing the circuit patterns. After each such exposure the photoresist is developed and then the underlying coating or coatings are etched. The wafer may then be recoated with photoresist and the process repeated a number of times until complete circuits are built up on the wafer which is then sliced into a plurality of individual chips each containing an identical complete circuit.

During some of these various steps, e.g., exposure and etching it is critical that the wafer be prealigned with respect to some standard prior to being transported into the exposure or etching apparatus. Such prealignment entails the centering of the wafer in the x, y, and $\theta$ directions according to a predetermined criteria dictated by the particular process to be undergone.

Various methods exist for wafer prealignment. Some of these utilize physical contact of the wafer. However, physical contact methods are often damaging to wafers which are quite fragile. Most other methods employ systems where the wafer is air borne, i.e., transported on a thin film of air. Centering is often accomplished by spinning the wafer by means of appropriately oriented air jets. The wafer is periodically stopped generally by use of a pulsating vacuum source. However, these systems require highly complex optical and electronic interface hardware or else result in unacceptable position errors.

BRIEF SUMMARY OF THE INVENTION

The present invention relates to an apparatus which utilizes the air spinning technique to roughly position a wafer in the x, y and $\theta$ directions. Three large area photovoltaic or solar cells are placed within a wafer supporting platform to detect x and y position of the wafer and two large area photovoltaic cells are positioned to detect the flat and, therefore, the angular position $\theta$ of the wafer. The wafer is spun by means of air jets from appropriately placed openings in the centering platform. At the same time the wafer is stopped periodically by means of a vacuum source communicating with the platform surface and pulsating at a first rate. When the photovoltaic cells are energized in a predetermined sequence indicative that the wafer is approaching a centered position, the vacuum pulse rate is increased until the photovoltaic cells indicate that the wafer is centered to within a first predetermined tolerance or rough position at which time the air and vacuum are turned off. Logic circuitry connected to the photovoltaic cells and control means including a microprocessor cause the change in the vacuum pulsing rate as well as cessation of the air and vacuum when the wafer is roughly positioned.

The wafer is then finely positioned to within a second predetermined tolerance. This is accomplished mechanically by vacuum fingers which grasp and raise the wafer from the platform. The control means including a microprocessor connected to the photovoltaic cells and stepping motor means cause the fingers to finely position the wafer, i.e., to within the second predetermined tolerance after which the wafer is lowered back onto the platform, released by the vacuum fingers and transferred to the work station.

DRAWINGS

FIG. 7 illustrates transfer arm detector 54 and its relationship to the rest of the system in more detail.

DESCRIPTION

Figure 1:
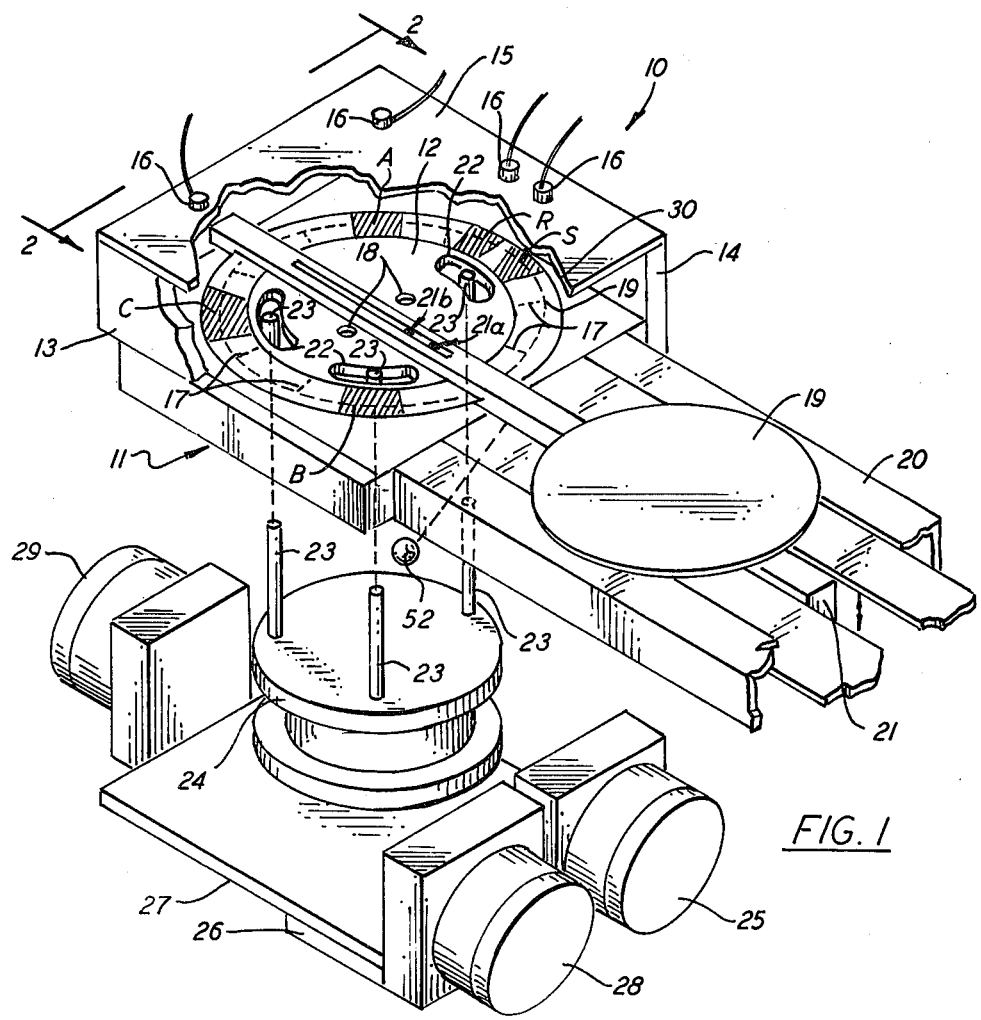
FIG. 1 is a pictorial representation of the prealignment platform station of the present invention.
Figure 2:
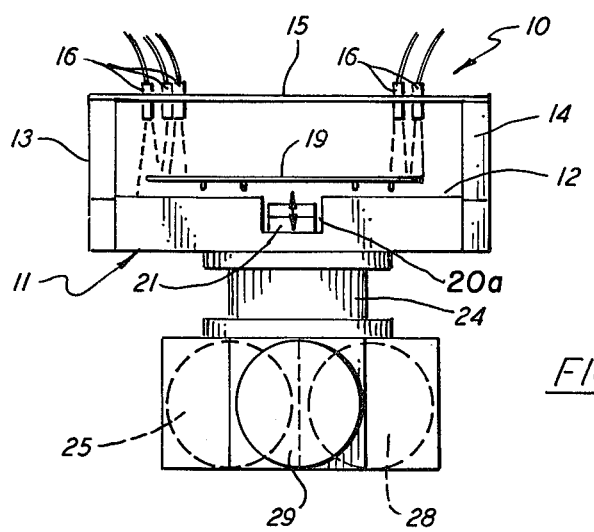
FIG. 2 is a side view of the prealignment platform station of FIG. 1 looking in the 2—2 direction.

Referring to FIG. 1 there is shown the prealignment platform station 10. The prealignment platform station 10 comprises an air block 11 which houses the conduits for supplying air and vacuum to the prealignment platform 12 which forms the top of platform station 10. The platform 12 is flat and contains embedded therein, five large area photovoltaic cells, i.e., solar cells A, B, C, R and S. These cells produce a voltage proportional to the amount of light impinging thereon.

Figure 5:
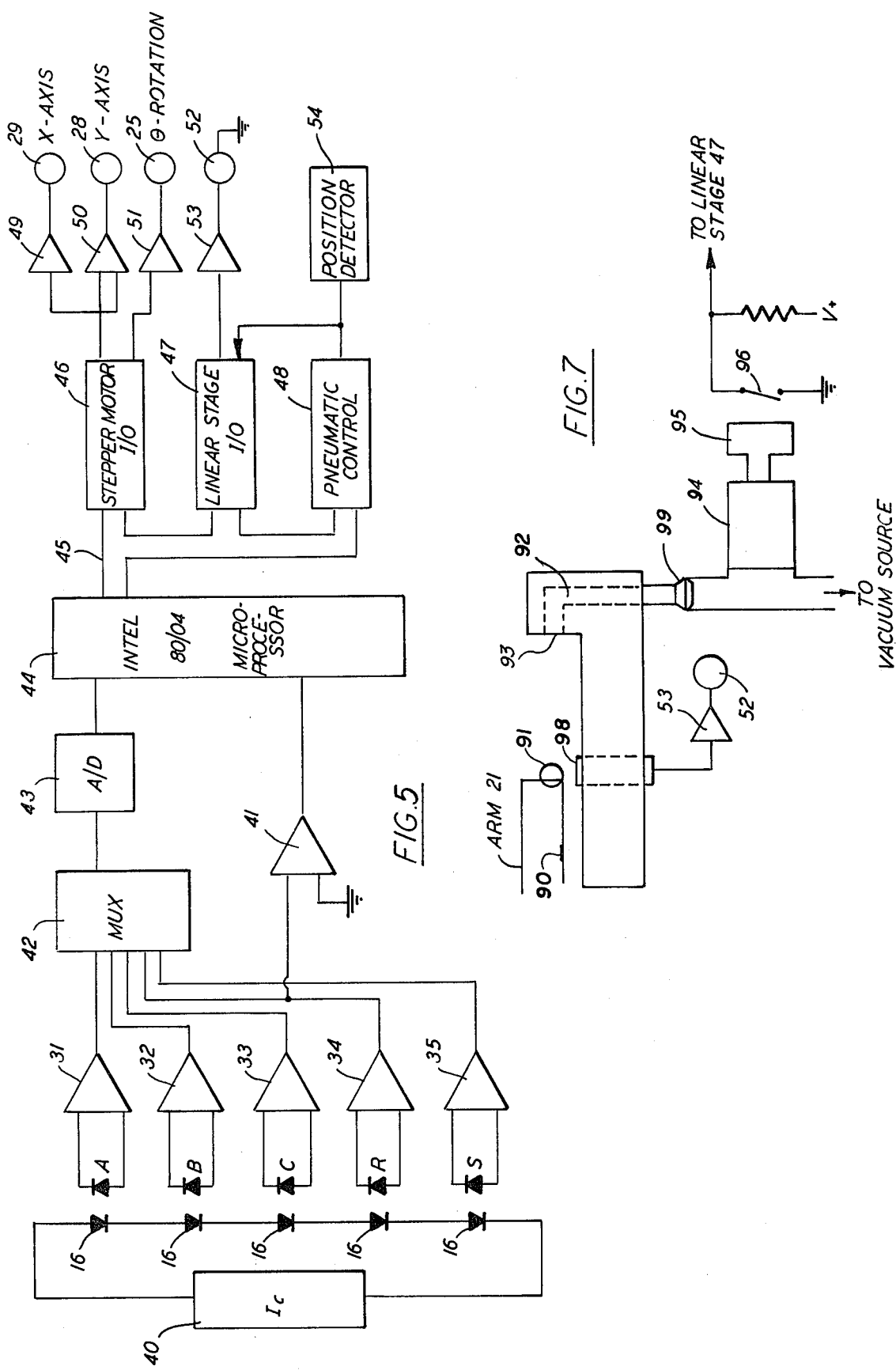
FIG. 5 is a block diagram of the control system of the present invention.

Walls 13 and 14 support a plate 15. Secured in apertures in the plate 15 are five light emitting diodes 16. Each of the light emitting diodes 16 is positioned over a solar cell A, B, C, R and S and each is connected to a constant current power source as shown in FIG. 5.

Formed in the surface of platform 12 are a series of orifices 17 which communicate to a source of air pressure 76 (shown in FIG. 7) via plenum chamber 30 which is formed in air block 11. The orifices 17 are oriented to impart a spin to any wafer which comes under their control by means of air jets issuing therefrom. The manner in which orifices 17 communicate with the source of pressurized air 76 via the plenum in air block is more fully described in connection with FIG. 7. The actual physical arrangement of the orifices 17, plenum and the interconnection thereof may be accomplished in any convenient manner well known in the prior art.

Also, disposed in the surface of the platform 12 are a pair of orifices or ports 18 spaced apart by approximately one inch. Orifices 18 are connected to a source of pulsating vacuum in a manner to be described more fully hereinbelow.

The spinning action imparted to a wafer 19 tends to center the wafer on platform 12. The pulsing vacuum periodically stops this spinning action and provides stability to the wafer. The combined action of the jets from orifices 17 and the pulsating vacuum at a first and then a second faster rate at orifices 18 function to center the wafer relatively accurately, e.g., to within ±20 mils in the x and y directions and ±1° in the $\theta$ or rotational direction. This degree of alignment is adequate, e.g. for prealigning a wafer for etching purposes. However, for purposes of prealigning a wafer prior to insertion into a mask projection aligner such as the Micralign mask projection aligner manufactured and sold by the assignee of the present invention the wafer must be aligned to a greater accuracy, i.e., of the order ±1 μm in the x and y direction and 0°0′30″ in the θ direction.

The wafer 19 is transported on a thin film of air to a position near platform 12 by means of air track 20. Air track 20 contains orifices (not shown) connected to a source of pressurized air and oriented to transport wafer 19 in a well known manner.

Air block 11 and air track 20 have a recess 20a for receiving a linear transfer arm 21. The upper surface of transfer arm 21 is normally disposed lower than the surface of platform 12 so as not to interfere with centering of a wafer on platform 12. Transfer arm 21 which is movable relative to platform 12 extends some distance along a recess in air track 20. The wafer is transferred on the thin film of air from air track 20 into the prealignment stage 10 until it comes under the control of the spinning air jets from orifices 17. After alignment the transfer arm 21 which includes one orifice 21a connected to a source of vacuum, is used to transfer the wafer 19 to the appropriate work station. When transfer arm 21 is actuated to move a wafer, it is first raised by any convenient means (not shown) by, e.g., bellows means connected to a source of pressurized air within recess 20a in a manner to be explained more fully hereinbelow.

As aforesaid, the spinning and vacuum pulsing techniques are sufficient for rough positioning of a wafer, i.e., to within a first tolerance.

The present invention also includes means for fine positioning of a wafer, i.e., to within a second tolerance.

The fine positioning means includes three vacuum fingers 23 which are received in slots 22 disposed in the surface of the platform 12. After rough positioning has occurred the vacuum fingers are adapted to be raised slightly and connected to a vacuum source to secure the wafer for fine positioning it by means of stepping motors in the x, y and θ directions in a manner to be described more fully hereinbelow. Once fine positioning is obtained the vacuum fingers 23 are retracted, the vacuum turned off and the wafer transferred by transfer arm 21 to the appropriate work station.

The fine position means in addition to vacuum fingers 23 includes a doughnut shaped element 24 to which vacuum fingers 23 are fixed. The element 24 is movable in the x y and θ directions. The element 24 is rotatably by means of a stepping motor 25 as shown schematically in FIG. 3.

Figure 3:
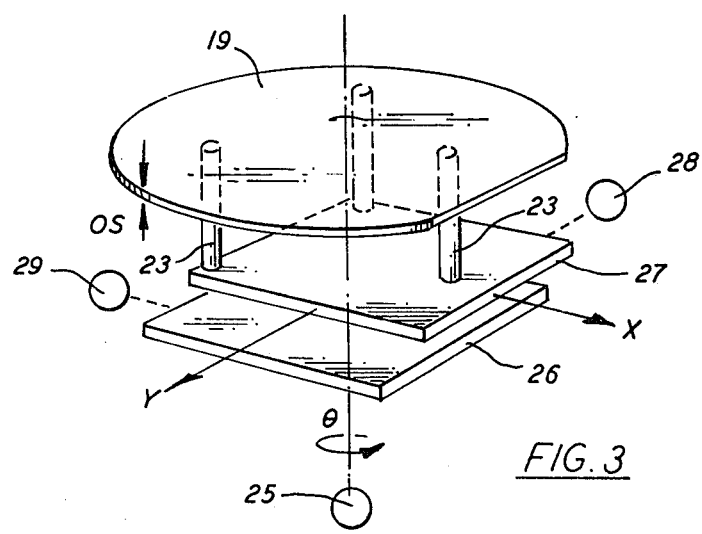
FIG. 3 is a pictorial representation of the mechanical arrangement of the fine aligner of the present invention.

Element 26 which is connected to move element 24 and, therefore, the wafer 19 is connected to stepping motor 28 as also shown schematically in FIG. 3 which drives element 26 in the ±x direction.

Similarly, element 27 is driven in the ±y direction via stepping motor 29 which in turn moves element 24 and wafer 19 in the ±y direction.

The foregoing arrangement which in actual practice may take one of several forms, e.g., gear connections between motors and elements is as aforesaid shown schematically in FIG. 3. FIG. 3 also shows the wafer 19 held by the vacuum fingers 23 which are in the raised position, i.e., raised slightly above the surface of platform 12.

FIG. 1 also shows the orientation of wafer 19 in its finely positioned orientation. In this position each of the solar cells is fifty percent covered by the wafer 19. In this position, the output signal of the solar cells A, B, C, R and S ideally meet the following criteria:

1. $A-B=0$ for x alignment,
2. $(A-C)+(B-C)=0$ for y alignment,
3. $R-S=0$ for θ or angular alignment.

Thus, ideally for fine alignment each of the above equations would equal zero. In actual practice to obtain the fine alignment conditions of x and y equal to ±1 μm and θ equal to 0°0″30″ some tolerance is permissible and in a practical embodiment the above fine alignment conditions are met if the above equations are equal to or less than a predetermined threshold value. The above expressions relate to fine alignment or the second predetermined tolerance previously mentioned.

In rough positioning which, as aforesaid is accomplished by air jet spinning and vacuum pulsing the same expressions 1, 2 and 3 are used with the difference that each may equal a higher voltage, i.e., a less restrictive threshold is necessary for rough alignment to position a wafer within the first predetermined tolerance.

Figure 4:
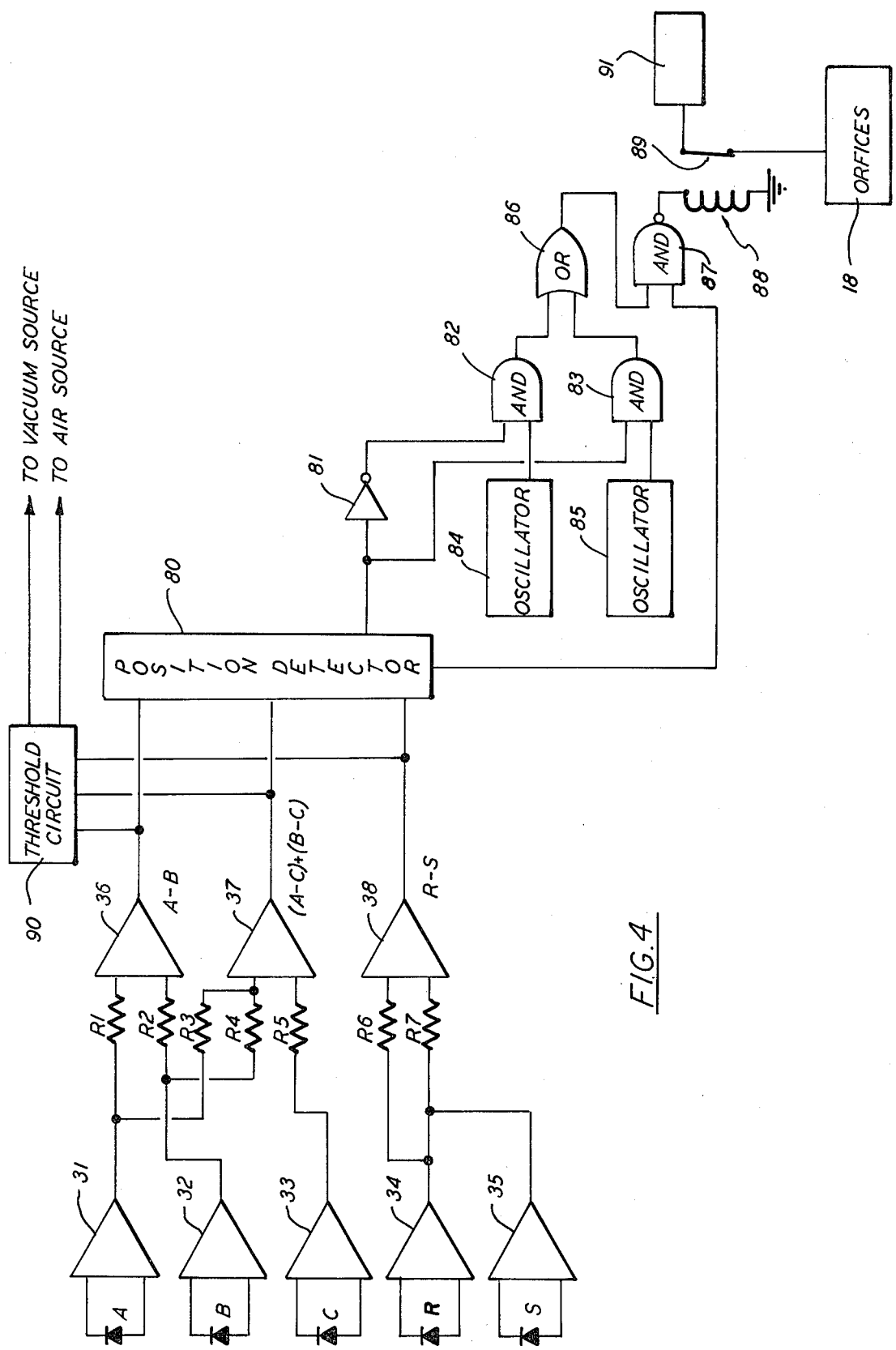
FIG. 4 is a representation of the logic circuit for providing output signals representative of the position of a wafer on the prealignment platform.

FIG. 4 illustrates the logic circuit for providing the left hand side of each of the expressions 1, 2 and 3, i.e., $A+B$; $(A-C)+(B-C)$; and $R-S$.

Differential amplifiers 31, 32, 33 and 34 and 35, which function as buffer amplifiers are connected to solar cells A, B, C, R and S, respectively. The output of amplifier 31 is connected to the inverting side of differential amplifier 36 through resistor $R_1$. The output of amplifier 32 is connected to the non-inverting input of differential amplifier 36 via resistor $R_2$. The output of differential amplifier 36 is, therefore, a voltage proportional to the quantity $A-B$ which is the output voltage of solar cell A minus the output voltage of solar cell B.

The output of amplifier 31 is connected to the inverting input of differential amplifier 37 via resistor $R_3$ and the output of amplifier 32 is also connected to the inverting input of differential amplifier 37 via resistor $R_4$. The output of amplifier 33 is connected to the non-inverting input of differential amplifier 37 via resistor $R_5$. This connection provides an output voltage at the output of differential amplifier 37 proportional to the quantity $(A-C)+(B-C)$ or $[C-(A+B)]/2$, i.e., the voltage output of solar cell C minus the sum of the voltage outputs from solar cells A and B all divided by two.

The output of amplifiers 34 and 35 are connected to the inverting input of differential amplifier 38 via resistor $R_6$ and the non-inverting input of differential amplifier 38 via resistor $R_7$, respectively. The output of differential amplifier 38 is a voltage proportional to the voltage from solar cell R minus the voltage from solar cell S or $R-S$.

When the outputs of differential amplifiers 36, 37 and 38 are all equal to zero, which is an ideal situation, wafer 19 is precisely centered. However, for practical purposes the wafer is deemed to be rough positioned when the three expressions 1, 2 and 3 are equal to or less than a first predetermined voltage, i.e., the first tolerance a finely positioned when the expressions are equal to or less than a second predetermined voltage, the second tolerance which, of course, is less than the first predetermined voltage indicative of rough positioning.

The outputs of amplifiers 36, 37 and 38 are connected to a wafer position detector 80. An output of position detector 80 is connected as one input to AND circuit 82 through an inverter 81 and is an input to AND circuit 83. The other input to AND circuit 82 is connected to an oscillator 84 which oscillates at a first rate of 4 Hz. The second input to AND circuit 83 is connected to oscillator 85 which oscillates at a second rate of 12 Hz, substantially faster than the rate of oscillator 84.

The outputs of AND circuits 82 and 83 are connected as inputs to OR circuit 86 whose output serves as one input to AND circuit 87. AND circuit 87 receives its second input from position detector 80. The output from position detector 80 is normally high and goes low when the system is deenergized.

The output of AND circuit 87 is connected to solenoid coil 88 which opens and closes valve 89 at a rate dependent on which oscillator 84 or 85 is in control. Thus, vacuum source 75 is connected to orifices 18 providing a vacuum at the pulsating rate of the oscillator 84 or 85.

When the output from position detector 80 is low, the AND circuit 82 receives a high via inverter 81 and the low rate oscillator 84 is in control causing the vacuum at orifices 18 to pulsate at the first rate. However, when the output is high, AND circuit 83 is gated and the high rate oscillator 85 is in control causing the vacuum at orifices 18 to pulsate at the second rate.

As aforesaid, the orifices 18 normally pulsate at the first or slow rate but when $A-B$ and $(A-C)+(B-C)$ equal a preselected voltage indicative that the wafer has reached acceptable rough alignment in the x and y directions and when solar cell R senses the first part of the main flat of wafer 19, the output to inverter 81 and AND circuit 83 goes high causing the vacuum at orifices 18 to pulsate at the second or higher rate as controlled by oscillator 85. Thus, as the wafer 19 approaches its rotational alignment, it is stopped more often giving better control of centering at this point. The position detector 80 may comprise nothing more than an AND circuit that receives a high on one input when the outputs $A-B$ and $(A-C)+(B-C)$ each are equal to or less than a predetermined voltage and a high at its second input when solar cell R senses the main flat of the wafer.

The outputs from amplifier 36, 37 and 38 are connected to a threshold circuit 90 which compares the three expressions to a predetermined voltage and when the expressions become equal to or less than that voltage, indicating an acceptable alignment of the wafer, signals are sent to the air supply providing the spinning jets at orifices 17 and to the vacuum source supplying vacuum at orifices 18 for disconnecting them from orifices 17 and 18 leaving the wafer aligned. The wafer may then be transferred to a work station.

The foregoing is a relatively simple arrangement for obtaining the rough alignment acceptable for some processing, e.g., etching.

A more sophisticated arrangement which provides rough alignment and then fine alignment is discussed in the reference to FIG. 5.

Solar cells A, B, C, R and S are connected to operational amplifiers 31, 32, 33, 34 and 35, respectively. Each of the solar cells is disposed adjacent to one of the light emitting diodes 16. The light emitting diodes are energized via a constant current source 40. The constant current source is used to maintain the output of the LED's 16 as uniform as possible. It should be noted that each of the solar cells A, B, C, R and S includes a filter for passing only the infrared light of the light emitting diodes 16. The cells A, B, and C detect the x and y positions of the wafer 19 and the R and S cells detect the angular or $\theta$ position of the wafer by sensing the major flat of the wafer 19.

The operational amplifiers 31–35 buffer or filter out fast perturbations or high frequencies associated with movement of the wafer, i.e, the amplifiers only respond to low frequency changes in state of the light. Amplifiers 31–35 also provide gain since the solar cell output is in the millivolt region.

The output of the amplifier 34 is connected to one side of operational amplifier 41 which also functions as a filter responding only to slow movements of the wafer, i.e, it filters out high frequencies associated with rapid movement of the wafer. Amplifier 41 is used to detect the major flat of a wafer when it comes into view of solar cell R.

Each of the amplifiers 31–35 are connected to multiplexer 42 which sequentially strobes the outputs of each of the amplifiers 31–35 providing each output in turn as an input to analog-to-digital or A/D converter 43.

The A to D converter 43 is connected to microprocessor 44 which in a practical embodiment of the present invention is an Intel 80/04 microprocessor.

The output of operational amplifier 41 is also connected to microprocessor 44.

The microprocessor 44 has an output bus 45 connected to stepper motor I/O 46, linear stage I/O 47 and pneumatic control 48. The output of stepper motor I/O 46 is connected to stepping motors 25, 28 and 29 via amplifiers 49, 50 and 51 for the fine positioning of the wafer.

The linear stage I/O 47 is connected to a motor 52 via an amplifier 53 for activating the transport arm 21 in the forward or reverse directions.

The pneumatic control 48 controls air and vacuum to the air jet orifices 17, vacuum ports 18, vacuum fingers 23 and the transfer arm 21.

A transfer arm position detector 54 which is discussed more fully hereinbelow with reference to FIG. 7 is connected to linear stage I/O 47 and is disposed to sense the position of linear arm 21 and provide a signal to linear stage I/O 47 to return the arm 21 to its home position after the wafer is aligned and delivered to the work station.

FIG. 7 illustrates transfer arm detector 54 and its relationship to the rest of the system in more detail.

Each end of transfer arm 21 includes a mark 90 and a ball 91. An optical detector 98 located at each end of travel of the transfer arm 21 is connected, e.g., optically to motor 52 via amplifier 53. When optical detector 98 senses mark 90, its output goes low causing the voltage to motor 52 to ramp down gradually slowing down movement of the transfer arm 21. This eliminates abrupt stops which may dislodge the wafer and destroy its alignment position.

A conduit 92 having an opening 93 for receiving ball 91 is connected to the source of vacuum. Also, connected to the conduit 92 via connector element 99 is a vacuum pressure detector 94 which in turn is connected to a pressure switch control 95. When transfer arm 21 reaches its end of travel position, opening 93 is closed by ball 91 which causes a change in vacuum. This is sensed by vacuum sensor and causes switch control 95 to close switch 96 thus signaling microprocessor 44 via linear stage 47 that transfer arm 21 is at its end of travel position. This information may be used by the microprocessor to deenergize transfer arm 21, i.e., lower it and remove vacuum from orifice 21a and/or to return it to its home position.

Figure 6:
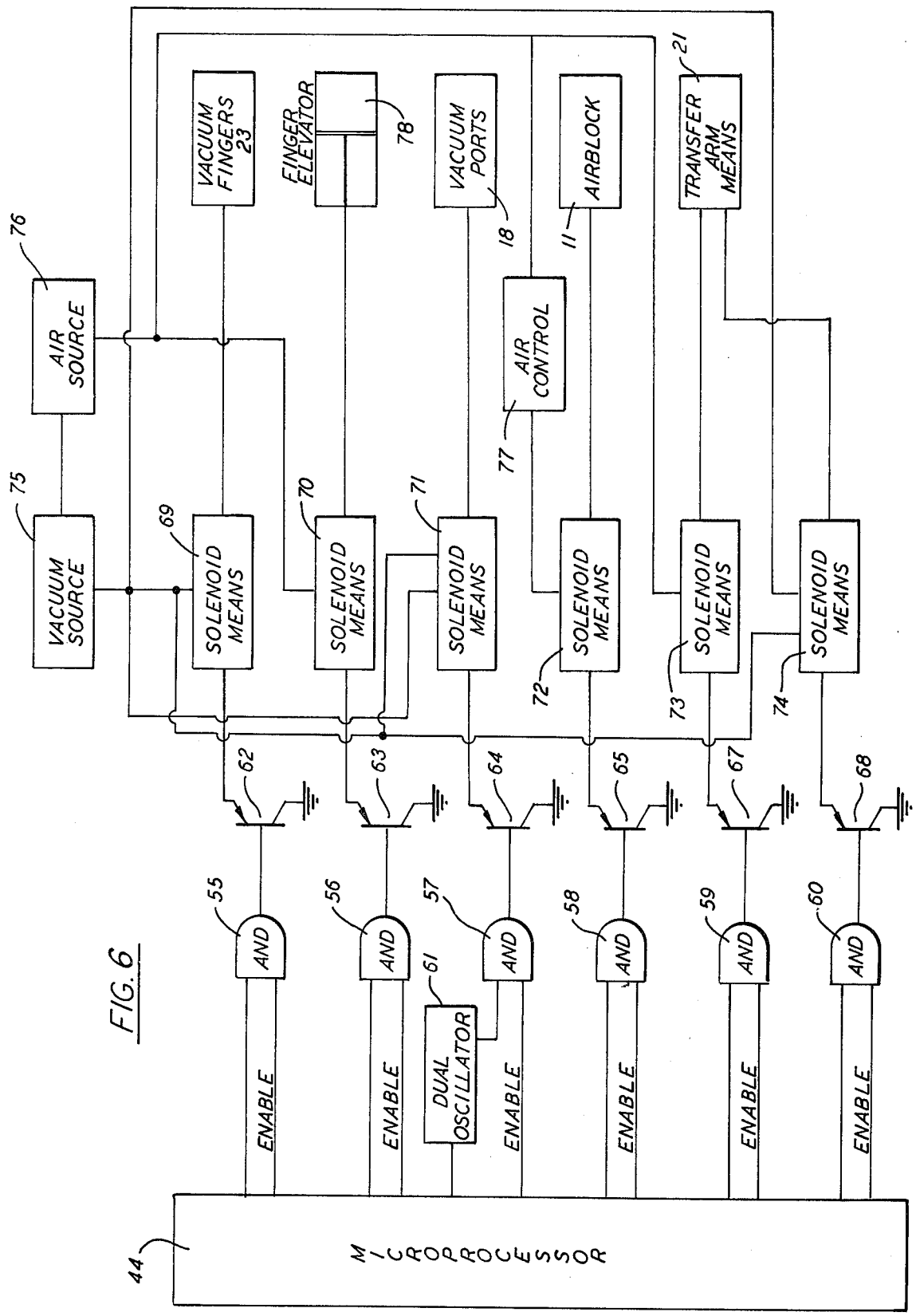
FIG. 6 is a schematic representation of the pneumatic control system of the present invention.

FIG. 6 shows pneumatic control 48 in detail. It comprises AND circuits 55, 56, 57, 58, 59 and 60 each having an enable input connected to microprocessor 44. The other input to AND circuits 55, 56, 58, 59 and 60 are connected to microprocessor 44 while the other input of AND circuit 57 is connected to microprocessor 44 via dual oscillator 61.

The outputs of each of AND circuits 55, 56, 57, 58, 59 and 60 are connected to the base of power transistors 62, 63, 64, 65, 67 and 68, respectively. Each of the transistors 62–68 is connected to a voltage source (not shown).

The outputs of transistors 62, 63, 64, 65, 67 and 68 are connected to solenoid means 69, 70, 71, 72, 73 and 74, respectively. Each of solenoid means 69, 70, 71, 72, 73 and 74 includes normally closed valve means (not shown) which are opened when their respective transistors 62–68 and energized on by commands from microprocessor 44.

A source of vacuum 75 is connected to solenoid means 69, 71 and 74 which are in turn, connected to vacuum fingers 23, vacuum ports 18 and the vacuum port 21a in transfer arm 21, respectively. As seen in FIG. 1 transfer arm includes a surface indentation 21b which extends from vacuum port 21a to extend the area of vacuum to provide more secure holding of the wafer.

A source of pressurized air 76 is connected to solenoid means 70, 72 via air control 77, and 73 which in turn is connected to finger elevator 78, air block 11 and transfer arm 21.

Thus, when solenoid means 69, 71 and 74 are energized by energizing transistors 62, 64 and 68, the normally closed valves therein connect vacuum source 75 to the vacuum fingers 23, the vacuum ports 18 and the vacuum port 21a of transfer arm 21. In an actual embodiment the vacuum at ports 18 is caused to pulsate at a rate determined by dual oscillator 61 which opens and closes the valve in solenoid means 71 at a first or second faster rate as determined by oscillator 61 which in turn is controlled by microprocessor 44.

When solenoid means 70, 72 and 73 are opened by the energization of transistors 63, 65 and 67, finger elevator 78 is energized to raise vacuum fingers 23, air is supplied to air block 11 to provide the spinning air jets at orifices 17, and to provide air to lift transfer arm to its raised position.

Air control 77 which may be a manually adjusted nozzle is used to maintain the air pressure at orifices at 10 psi ±0.5 psi.

The sequence and timing of each of the above described functions is under the control of the microprocessor 44 in accordance with a program, a copy of which is appended to and incorporated by reference as part of this specification.

The operation of the present invention is described below.

When power is turned on the LED's 16 are energized and AND circuit 58 turns on transistor 65 to operate solenoid 72 to connect air source 76 to plenum 30 formed in air block 11. This causes the spinning air jets to issue through orifices 17.

At the same time a wafer 19 is released to the air track 20 which directs the wafer on to the platform 12. When solar cell B senses the wafer, AND circuit 57 turns transistor 64 on and at a rate determined by dual oscillator 61 to connect vacuum source 75 to vacuum ports 18 at a first rate determined by the frequency of oscillator 61.

The wafer is moved further onto the platform 12 by the air jets issuing from orifices 17 causing the wafer to begin to spin. This spinning centers the wafer. When the wafer is centered within a first limit, i.e., when the expressions $A-B$ and $(A-C)+(B-C)$ equal a first limit as determined by microprocessor 44 and when solar cell R senses the first part of the main flat of the wafer which information is supplied to microprocessor 44 via operational amplifier 41, the frequency of dual oscillator 61 is changed to a higher frequency causing solenoid 71 to turn on and off at a faster rate and, therefore, increase the pulsing rate at orifices 18, thus stopping the spinning of wafer more frequently. When $R-S$ is equal to a first limit as determined by microprocessor 44, the wafer is roughly positioned, i.e., its position is within a first predetermined tolerance. At this time the vacuum at vacuum ports 18 stops pulsating by the deenergization of dual oscillator 61, to hold the wafer 19 in its rough aligned position.

At this time the fine alignment of the wafer is initiated. To accomplish fine positioning, AND circuit 55 energizes solenoid means 69 which connects vacuum source 75 to vacuum finger 23. At the same time AND circuits 56 energizes transistor 63 to energize finger elevator 78 to raise the vacuum fingers 23 slightly above the surface of platform 12. At the same time air to orifices 17 and vacuum to orifices 18 is terminated by deenergization of transistors 64 and 65. Thus, the wafer is secured to vacuum fingers 23 which are in a raised state.

Microprocessor 44 which receives signals from solar cells A, B, C, R and S via multiplexer 42 and analog to digital converter 43 utilizes that data to process the three expressions $A-B$, $(A-C)+(B-C)$ and $R-S$ to energize motors 29, 28 and 25 to move the fingers in the x, y and $\theta$ directions until each of the expressions are equal to or less than a predetermined value indicative that the wafer is fine positioned, i.e., to within a second predetermined tolerance.

At this time vacuum to the vacuum fingers 23 is terminated and the vacuum fingers are lowered to their original position. As the fingers 23 are lowered, transistors 67 and 68 are energized to connect air source 76 and vacuum source 75 to transfer arm 21 to raise it relative to platform 12 and secure the wafer 19 via vacuum orifice 21a. This leaves the wafer 19 fine positioned. The motor 52 is then energized in the appropriate direction transferring the wafer 19 to the work station. When transfer arm 21 reaches the work station as sensed by position detector 54 air and vacuum are disconnected from transfer arm 21 thus releasing the wafer 19 to the work station. The transfer arm 21 is then returned to its home position as sensed by position detector 54 by motor 52 and is ready to accept another wafer to initiate a repeat of the cycle.

As should be clear the foregoing description of operation of the present invention is a detailed step by step word description of the sequenntial flow of operation of the system as carried out by microprocessor 44 under control of the program hereinafter disclosed.

Other modifications of the present invention are possible in light of the above description which should not be construed as placing any limitations on the present invention beyond those expressly set forth in the claims which follow:

What is claimed is:

1. An apparatus for aligning a wafer, comprising,
a platform for receiving the wafer,
a plurality of air jet orifices disposed through the surface of said platform oriented to spin the wafer,
a source of air,
first valve means for connecting said source of air to said orifices, at least two pulsating vacuum orifices disposed through the surface of said platform for periodically stopping the wafer during its spin,
a source of vacuum,
second valve means for connecting said source of vacuum to said vacuum orifices,
control means causing said pulsating vacuum orifices to pulsate at a first rate and at a second rate faster than said first rate when the wafer reaches a predetermined position in its spin,
solar cell means disposed in said platform providing signals representative of the position of the wafer on said platform in the $\alpha$, y and $\theta$ directions,
oscillator means connected to said solar cell means and with said second valve means for connecting and disconnecting said source of vacuum to said vacuum orifices at said first rate and at said second rate when said wafer reaches said predetermined position,
first means included within said control means connected to said first and second valve means for disconnecting said source of air and said source of vacuum from said air jet orifices and vacuum orifices, respectively, when the wafer is positioned to within a first predetermined tolerance,
mechanical means connected to said control means for moving the wafer in the $\alpha$, Y and $\theta$ directions until the signals from said solar cell means equal a predetermined value indicative that the wafer is centered to within a second predetermined tolerance.

2. An apparatus according to claim 1 wherein said solar cell means comprises,
first, second and third solar cells for sensing position of the wafer in the x and y directions, and
fourth and fifth solar cells for sensing position of the main flat of the wafer.

3. An apparatus according to claim 2 further comprising,
stepping motor means connected between said control means and said mechanical means for moving the wafer in the x, y and $\theta$ directions until the outputs from said first, second, third, fourth and fifth solar cells are equal to or less than a predetermined voltage indicative that the wafer has been positioned to within said second predetermined tolerance.

4. An apparatus according to claim 3 wherein said mechanical means comprises,
at least three vacuum fingers disposed within slots in said platform,
third valve means connected to said control for raising said vacuum fingers above the surface of said platform after the wafer has been positioned to within said first predetermined tolerance and lowering said vacuum fingers after the wafer has been positioned to within said second predetermined tolerance,
fourth valve means connected to said control means for connecting vacuum to said vacuum fingers for securing the wafer thereto when said vacuum fingers are in the raised position.

* * * * *

UNITED STATES PATENT AND TRADEMARK OFFICE
CERTIFICATE OF CORRECTION

PATENT NO. : 4,425,075

DATED : January 10, 1984

INVENTOR(S) : Peter W. Quinn

It is certified that error appears in the above-identified patent and that said Letters Patent are hereby corrected as shown below:

Column 9, line 13, change "a" to --$\alpha$--,

Column 9, line 28, change "a" to --$\alpha$--.

Signed and Sealed this

Sixth Day of November 1984

[SEAL]

Attest:

Attesting Officer

GERALD J. MOSSINGHOFF

Commissioner of Patents and Trademarks